US006226628B1

(12) United States Patent
Forbes

(10) Patent No.: US 6,226,628 B1
(45) Date of Patent: May 1, 2001

(54) CROSS-FILE PATTERN-MATCHING COMPRESSION

(75) Inventor: Jonathan Forbes, Bellevue, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/104,162

(22) Filed: Jun. 24, 1998

(51) Int. Cl.[7] .......... G06F 17/30

(52) U.S. Cl. .......... 707/1; 707/2; 707/6; 707/101

(58) Field of Search .......... 707/1, 2, 3, 6, 707/101

(56) References Cited

U.S. PATENT DOCUMENTS

| | | | | |
|---|---|---|---|---|
| 4,672,539 | * | 6/1987 | Goertzel | 710/68 |
| 5,357,431 | * | 10/1994 | Nakada et al. | 364/419 |
| 5,426,779 | * | 6/1995 | Chambers, IV | 707/1 |
| 5,506,580 | * | 4/1996 | Whiting et al. | 341/51 |
| 5,659,730 | * | 8/1997 | Kelly et al. | 707/3 |
| 5,822,746 | * | 10/1998 | Williams | 707/1 |
| 5,999,949 | * | 12/1999 | Crandall | 707/532 |
| 6,003,043 | * | 12/1999 | Hatakeyama et al. | 707/203 |

* cited by examiner

*Primary Examiner*—John Breene
*Assistant Examiner*—Cheryl Lewis
(74) *Attorney, Agent, or Firm*—Lee & Hayes, PLLC

(57) ABSTRACT

A method of providing data files includes compressing the files using a cross-file compression technique. The technique makes use of ancillary files that are stored along with the data files. The ancillary files include lookup tables and indexes. A lookup table for a data file indicates the position of the last occurrence of individual data values within the data file. Each displacement index for a data file indicates displacements from respective data elements to prior strings of a particular match length that match strings of the particular match length begun by the respective data elements. Indexes corresponding to different match lengths are provided. In response to client requests for subsets of available data files, a server compresses each subset of data files using a pattern-matching compression scheme that attempts to represent given strings by referencing prior matching strings across file boundaries. To find a prior matching string for a string begun by a current data element in a current data file, the server finds a previous matching string in the current data file by referencing the displacement indexes associated with the current data file, and then searches for a larger matching string in previous data files by referencing the lookup tables and displacement indexes associated with the previous data files.

35 Claims, 5 Drawing Sheets

| String | A | B | C | D | E | A | B | G | A | B | C | D | A | B | C | F | A | B | C | D | E |
|---|---|---|---|---|---|---|---|---|---|---|---|---|---|---|---|---|---|---|---|---|---|
| Position | 0 | 1 | 2 | 3 | 4 | 5 | 6 | 7 | 8 | 9 | 10 | 11 | 12 | 13 | 14 | 15 | 16 | 17 | 18 | 19 | 20 |

Fig. 3

| Value | A | B | C | D | E | F |
|---|---|---|---|---|---|---|
| Position | 16 | 17 | 18 | 19 | 20 | 15 |

Fig. 4

| String | A | B | C | D | E | A | B | G | A | B | C | D | A | B | C | F | A | B | C | D | E |
|---|---|---|---|---|---|---|---|---|---|---|---|---|---|---|---|---|---|---|---|---|---|
| Position | 0 | 1 | 2 | 3 | 4 | 5 | 6 | 7 | 8 | 9 | 10 | 11 | 12 | 13 | 14 | 15 | 16 | 17 | 18 | 19 | 20 |

| | | | | | | | | | | | | | | | | | | | | | |
|---|---|---|---|---|---|---|---|---|---|---|---|---|---|---|---|---|---|---|---|---|---|
| Index 3 | | | | | | | | | 8 | 8 | | | 4 | | | | 4 | 8 | 16 | | |

Fig. 5

| String | A | B | C | D | E | A | B | G | A | B | C | D | A | B | C | F | A | B | C | D | E |
|---|---|---|---|---|---|---|---|---|---|---|---|---|---|---|---|---|---|---|---|---|---|
| Position | 0 | 1 | 2 | 3 | 4 | 5 | 6 | 7 | 8 | 9 | 10 | 11 | 12 | 13 | 14 | 15 | 16 | 17 | 18 | 19 | 20 |

| | | | | | | | | | | | | | | | | | | | | | |
|---|---|---|---|---|---|---|---|---|---|---|---|---|---|---|---|---|---|---|---|---|---|
| Index 1 | | | | | | 5 | 5 | | 3 | 3 | 8 | 8 | 4 | 4 | 4 | | 4 | 4 | 4 | 8 | 16 |
| Index 2 | | | | | | 5 | | | 3 | 8 | 8 | | 4 | 4 | | | 4 | 4 | 8 | 16 | |
| Index 3 | | | | | | | | | 8 | 8 | | | 4 | | | | 4 | 8 | 16 | | |
| Index 4 | | | | | | | | | 8 | | | | | | | | 8 | 16 | | | |
| Index 5 | | | | | | | | | | | | | | | | | 16 | | | | |
| Index 6 | | | | | | | | | | | | | | | | | | | | | |

Fig. 6

CROSS-FILE PATTERN-MATCHING COMPRESSION

TECHNICAL FIELD

This invention relates to systems and methods for compressing different groups of files in response to variable requests by clients for such groups of files.

BACKGROUND OF THE INVENTION

Although the amount of available digital information has mushroomed in recent years, limited data storage capacities and data communications bandwidths sometimes threaten the practicality of distributing this information. To deal with storage and bandwidth limitations, the use of data compression has become almost universal.

Various data compression techniques are available, two of the more popular being known as "zip" and "gzip". Both of these compression techniques utilize some form of pattern matching compression, in which a string beginning at a current data element is represented by referencing a previous, identical string. A well-known example of pattern matching compression (variations of which are used within both zip and gzip) is referred to as "LZ77".

Pattern matching compression involves sequentially examining data elements (also referred to herein as characters) and strings of data elements from a data input stream, and noting any strings that are repetitions of previously encountered identical strings. When the algorithm encounters an occurring string that matches a previously encountered string, the algorithm records two values in place of the occurring string: a length value and a displacement or distance value. The length value indicates the length of the matching strings. The displacement value indicates the number of elements back in the input stream to the previously occurring and matching string.

When the algorithm encounters a data element that cannot be matched to a previously encountered string, the algorithm records the value of the element itself. Such an element is referred to as a "literal" or "literal element."

Typically, the compressed data stream comprises literals with interspersed length/displacement pairs. A length element is always followed by a displacement element in the compressed data string.

In implementing a compression engine for pattern matching compression, it is usually desired to avoid repeated exhaustive searches of prior data elements. Instead, there is usually some way to record the locations of different strings as they are encountered, to ease the job of finding such strings when processing subsequent characters and strings. In many implementations, one or more lookup tables or hash tables are created and updated as the compression proceeds. A hash table contains a plurality of entries, each pointing to a linked list of previous input stream locations. As the algorithm advances through an input stream, it references the hash table and the linked lists to find previous matching strings, and also updates the table and lists to account for newly encountered data.

As an example, suppose a hash table such as this is indexed by three characters, and that the compression algorithm is attempting to match the string "bdeefis . . .". Referencing the hash table yields a linked list that leads to all previous strings that begin with the three characters "bde". The algorithm performs a string compare at locations of all such previous strings, to determine which yields the longest matching string.

As an improvement to this scheme, multiple hash tables are sometimes maintained, corresponding to different match lengths. For example, one hash table might be indexed with three characters, while another is indexed with four. In this case, the hash table and linked lists with the largest number of index characters are referenced first. Tables and lists with smaller numbers of index characters are referenced only if needed.

The preceding discussion is somewhat simplified, but is sufficient for understanding the characteristics of pattern matching compression that are pertinent to the invention. Further details regarding compression techniques can be found in M. Nelson & J. Gailly, *The Data Compression Book,* (2d ed. 1996), which is hereby incorporated by reference. In addition, specifications for the gzip and zip compression techniques can be found in Internet RFCs 1951 and 1952, which are also incorporated by reference.

The scheme described above works well for individual files. Groups of files can also be compressed by concatenating them so that matches can be found across file boundaries. This is referred to as "cross-file" pattern matching compression. Especially for short files, cross-file compression is much more efficient than independently compressing individual files—the longer input stream makes it more likely that matches will be found among the earlier data elements.

In a server environment, or any other environment where files are to be distributed through limited-bandwidth distribution channels, it is generally desired to store files in their compressed formats. This avoids the need for the server to recompress the files every time they are transmitted. If groups of files are to be transmitted, they can be concatenated, compressed using cross-file compression, and stored in their concatenated and compressed state.

In many situations, however, it is not possible to predict which combinations of files will be requested from a server. In these situations, the files must be compressed and stored individually—thus forgoing the advantages of cross-file compression. Alternatively, the files can be stored uncompressed, and then concatenated and compressed (using cross-file compression) in response to client requests. However, this places a tremendous load on the server, since each request requires fresh compression efforts.

SUMMARY OF THE INVENTION

The invention makes use of ancillary files that are stored along with data files. The ancillary files contain preprocessed data relating to characters, strings, and string matches within the individual files.

More specifically, a lookup table is created and stored along with each data file. The lookup table indicates the position in the data file of the last occurrence of each different data value.

In addition, a plurality of displacement indexes are created and stored along with each data file. Each index corresponds to a specific match length, and has entries corresponding respectively to different characters of the data file. For each character, an index indicates a displacement back to a previous matching string of the given match length.

In response to a request for a specific set of files, a server performs cross-file, pattern-matching compression, taking advantage of the data provided in the ancillary files. To find a match for a string beginning with a given character (referred to as the current element or character), the server first utilizes the indexes associated with the current data file to find the largest match within the same file. The server then references the ancillary files associated with previous data files in order to find any larger matching strings in those data files.

BRIEF DESCRIPTION OF THE DRAWINGS

FIG. 3 is a table showing an example of a data string, along with an indicate of the absolute positions of each element of the data string.

FIG. 4 is a table showing an example of a lookup table in accordance with the invention.

FIG. 5 is a table showing an example of an index in accordance with the invention, along with the data string of FIG. 3.

FIG. 6 is a table showing an example of a plurality of indexes in accordance with the invention, along with the data string of FIG. 3.

DETAILED DESCRIPTION

This invention pertains generally to a server system that receives client requests for multiple files or data objects. The server has access to a great number of such files, and individual clients can request different subsets of the files. Before transmitting requested files, the server compresses the files using a pattern matching technique. The files are concatenated before compression to obtain the benefits of cross-file compression. To lessen the work required when files are requested, the individual files are pre-processed. The pre-processing results in ancillary files that are stored along with the data files, giving information that speeds subsequent compression.

General Architecture

Figure 1:
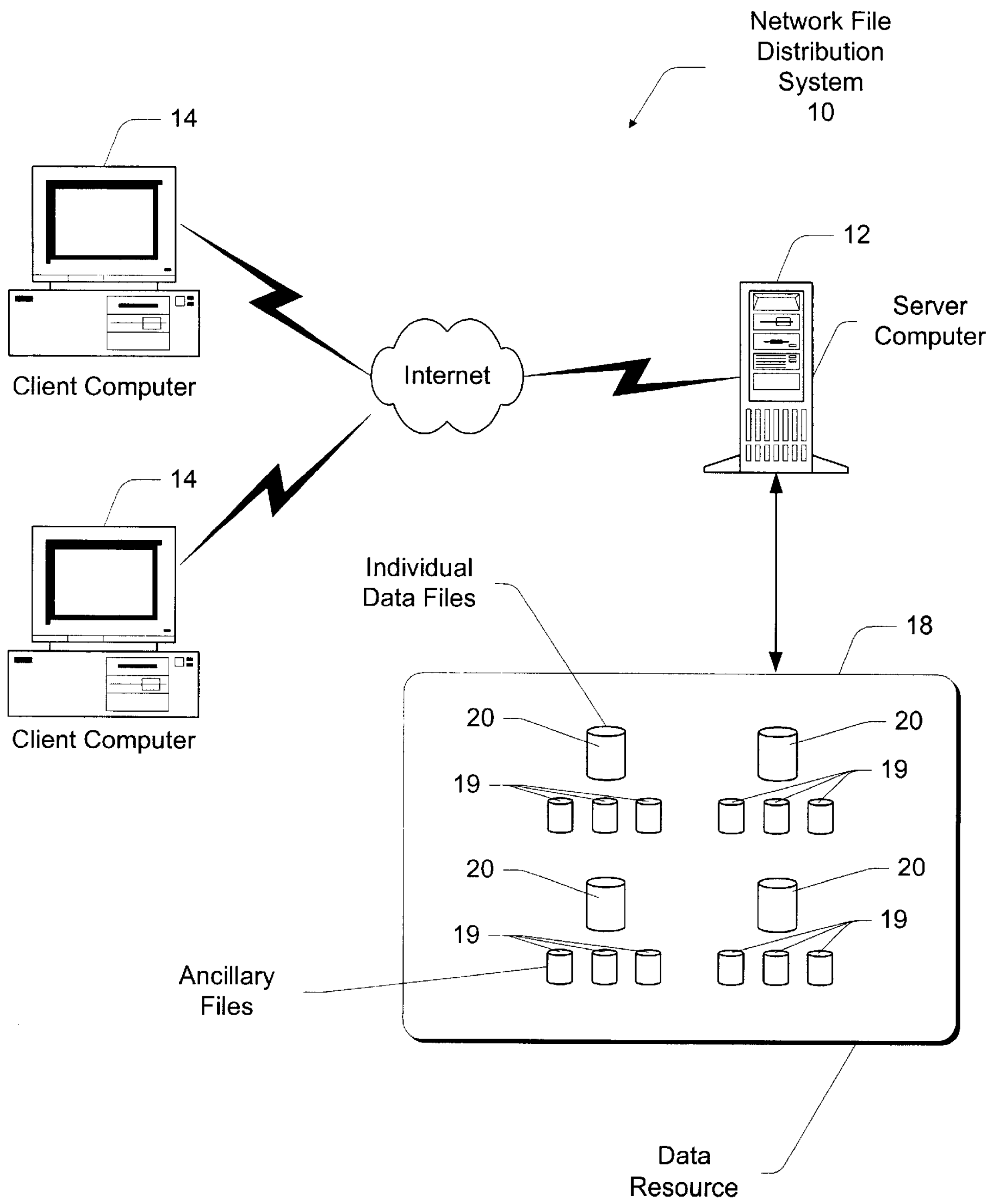
FIG. 1 is a block diagram showing a client/server system in accordance with the invention.

FIG. 1 shows a network file distribution system 10 comprising a server computer 12 and a plurality of client computers 14. The different computers communicate through a network communications medium. In this case, the server is an Internet WWW (World-Wide Web) server, and communicates with the client computers over the public Internet. However, other types of networks and communications media can also be employed.

The server computer has access to a data resource 18 containing a plurality of individual data files 20. In this disclosure, the term "file" is used to indicate a discrete collection of data which is available individually to a client computer. Each client computer can request a variable subset of files 20.

Figure 2:
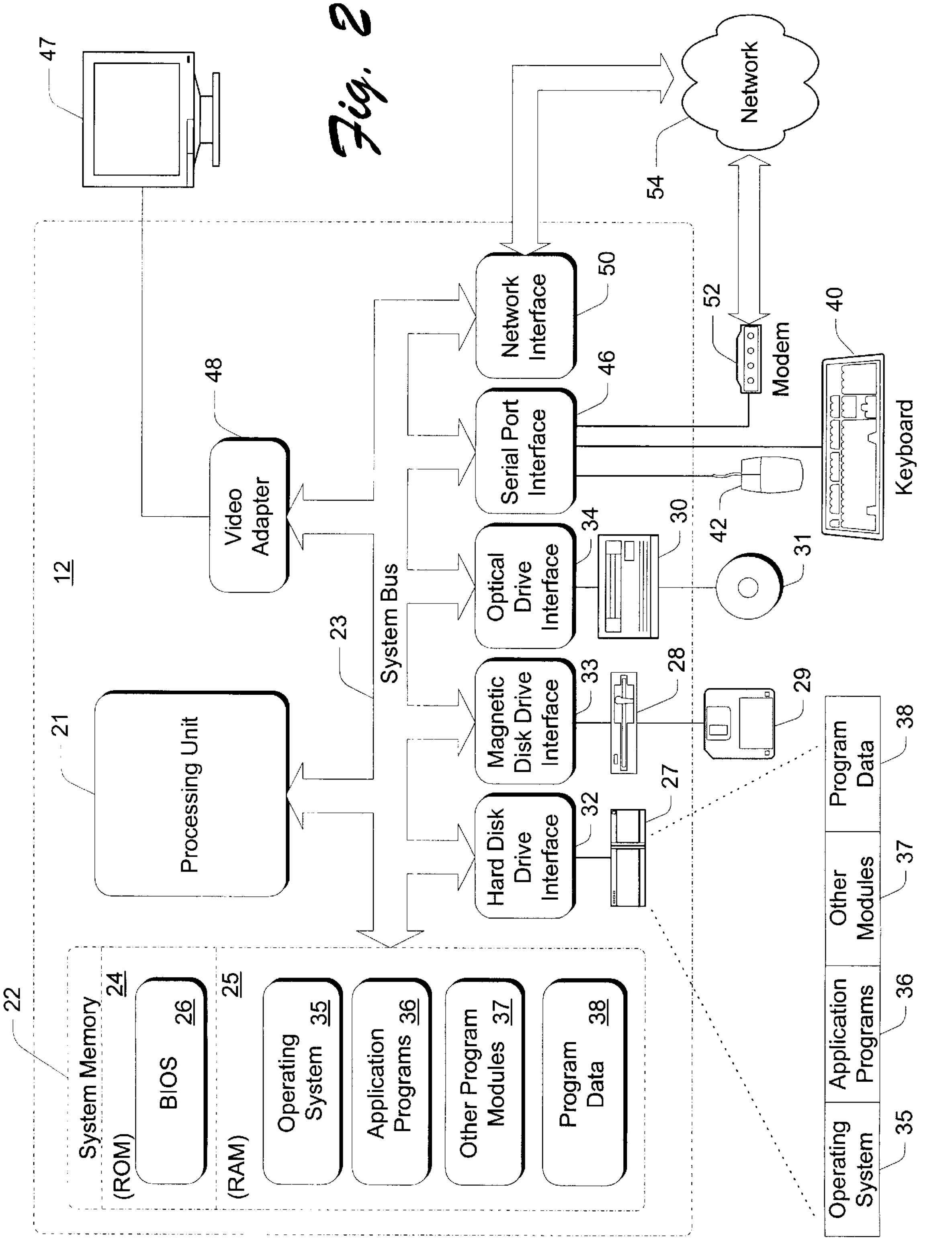
FIG. 2 is a block diagram showing pertinent components of a server in accordance with the invention.

FIG. 2 shows an example implementation of a server computer 12. In the described embodiment, the invention is implemented at least in part with computer-executable instructions, such as program modules, that are executed by server computer 12. Generally, program modules include routines, programs, objects, components, data structures, etc. that perform particular tasks or implement particular abstract data types.

Server computer 12 includes a microprocessor or other processing unit 21, a system memory 22, and a system bus 23 that couples various system components including the system memory to the processing unit 21. The system bus 23 may be any of several types of bus structures including a memory bus or memory controller, a peripheral bus, and a local bus using any of a variety of bus architectures. The system memory includes read only memory (ROM) 24 and random access memory (RAM) 25. A basic input/output system 26 (BIOS), containing the basic routines that help to transfer information between elements within computer 12, such as during start-up, is stored in ROM 24.

Computer 12 includes a hard disk drive 27 for reading from and writing to a hard disk, a magnetic disk drive 28 for reading from or writing to a removable magnetic disk 29, and an optical disk drive 30 for reading from or writing to a removable optical disk 31 such as a CD ROM or other optical media. The hard disk drive 27, magnetic disk drive 28, and optical disk drive 30 are connected to the system bus 23 by a hard disk drive interface 32, a magnetic disk drive interface 33, and an optical drive interface 34, respectively. Other configurations might include different types of computer-readable data media.

A number of program modules may be stored on the hard disk, magnetic disk 29 optical disk 31, ROM 24, or RAM 25, including an operating system 35, one or more application programs 36, other program modules 37, and program data 38. Microprocessor 21 is programmed by means of such components, which are stored at different times in the different types of available computer-readable storage media (for purposes of illustration, the program components are shown in RAM in FIG. 1). The invention described herein includes these various types of computer-readable storage media when such media contain instructions or programs for implementing the described steps in conjunction with a microprocessor or other data processor. The invention also includes the system or server computer itself when programmed according to the methods and techniques described below. Furthermore, the invention includes data structures, as described below, that are stored on the computer-readable storage media associated with server computer 12.

A user may enter commands and information into the server computer 12 through input devices such as a keypad or keyboard 40 and/or a pointing device 42. Other input devices (not shown) may include a microphone, joystick, game pad, or the like. The input devices can be connected to the processing unit 21 through a serial port interface 46 that is coupled to the system bus, but may be connected by other interfaces, such as a parallel port, game port, or a universal serial bus (USB).

A CRT 47 or other type of display device is also connected to the system bus 23 via an interface, such as a video adapter 48. In addition to the monitor, the computer might include other peripheral output devices that are not shown, such as speakers.

The server computer 12 has a network interface or adapter 50, a modem 52, or other means for establishing communications over Internet 54 or some other computer network.

Pre-Compression

Data files 20 are stored and provided by server 12. Each of data files 20 contains a plurality of ordered data elements or characters. Each respective data element begins one or more strings of different lengths. A string is an ordered sequence of one or more characters such as "abcdefg". The element "b" in this example string begins six different strings: "b", "bc", "bcd", "bcde", "bcdef", and "bcdefg".

As mentioned above, ancillary files are associated with data files. Such files are indicated generally in FIG. 1 by reference numeral 19. The ancillary files include lookup tables and indexes. Generally, a lookup table associated with a particular data file has data that allows server computer 12 to find the last occurrence of a particular data element or data element string in the data file. An index indicates, for each respective data element of a data file, the location of the most recent string of a particular length that matches a string begun by the data element. Although lookup and index data structures are shown as discrete files, they can be combined. Furthermore, the ancillary files associated with a particular data file can be combined into a single file structure with the data file itself.

In one embodiment of the invention, each data file is associated with a to single lookup table and a plurality of indexes. In this case, the lookup table has an entry for each possible data element value, indicating the last occurrence of each data element value in the associated data file. The position of the data element is preferably indicated as an offset from the end of the data file.

FIG. 3 shows an example of an ordered string or sequence of characters contained by a data file 20. The string is shown in the first row of the table. The second row indicates the absolute positions of the characters in the data file, solely for discussion purposes. The position numbers are not part of the data file.

FIG. 4 shows an example of a lookup table corresponding to the string shown in FIG. 3. The table is indexed by the first row. For any given character in the available character set (which has been limited here to A through F for purposes of discussion), the table indicates the absolute position of the last occurrence of that value in the string of FIG. 3.

In an alternative embodiment, there might be several lookup tables associated with a data file. Each of these lookup tables corresponds to a particular string length, and indicates potential last occurrences of different strings of that string length in the data file. For example, one lookup table might indicate the last occurrence of different data element values, while another lookup table indicates the last occurrence of different strings having a length of two elements. As a further alternative, some of such lookup tables, especially any used for matching previous strings of two or more elements, might be hash tables.

In the embodiment described herein, the indexes are displacement indexes. Each displacement index corresponds to a particular match length and indicates the displacement from a respective data element to a prior string that matches a string of the match length begun by the data element.

FIG. 5 shows the characters of a data file 20 as illustrated in FIG. 3, and additionally illustrates a displacement index for a match length of three. The index is structured in a way such that each displacement value corresponds to a particular one of the data elements of the data file. In this illustration, the displacement value corresponding to a particular character is aligned directly below that character. Thus, the first "8" value in the index corresponds to the "A" data element directly above, and indicates that a matching string of length 3 ("ABC") is located eight elements back in the data. A blank or null value beneath a character means that there is no preceding string of the required match length that matches the string begun by the character.

A plurality of such indexes are provided and stored for each data file. FIG. 6 indicates the indexes corresponding to match lengths of 1 through 6, continuing the example given above. For the sake of brevity, each index will be referred to as "index x," where x is the match length of the index. Generally, it is desirable to provide at least four displacement indexes, for match lengths of one through four. However, it is also desirable to limit the number of indexes to no more than ten. There are diminishing returns as the number of indexes increases.

The lookup tables and indexes allow a pattern matching compression algorithm to quickly find previous matching strings. For example, suppose one is attempting to find a match for the string beginning at position 8 ("ABCDABCFA . . . "). All that is required is to examine the index entries corresponding to position 8, starting with index 6. The entries in indexes 5 and 6 are blank, and thus the highest match length turns out to be 4. The appropriate entry in index 4 indicates a matching string at a rearward displacement of 8, at the absolute position of 0 (8 minus 8).

In some cases, slightly more effort is required. Particularly, more effort is required when a match is indicated by the index having the highest match length (6 in the example of FIG. 6). In this case, it is desirable to link backward through the file, using the index, and perform a string compare at each location to find the largest matching string. This method reveals any previous matching strings having a match length greater than 6.

The lookup tables and indexes are stored with the data files for use during later compression activities.

Cross-File Compression

Server 12 is configured to provide different subsets of the available data files to clients in response to requests from such clients for such subsets. When a client requests a particular subset of the files available from server 12, the server references the lookup tables and indexes associated with the data files of the requested subset to compress the subset of files across file boundaries before providing them to the requesting client. The server uses a pattern-matching compression scheme that attempts to represent given strings by referencing prior matching strings, across file boundaries.

The process of finding matching strings is performed by referencing the lookup tables and indexes associated with the requested files. The server sequentially examines data elements of each file. To find a previous matching string in the same file, the server references the displacement indexes associated with that data file. The server then searches for a larger matching string in previous files of the requested subset of files by referencing the displacement indexes associated with those files.

Figure 7:
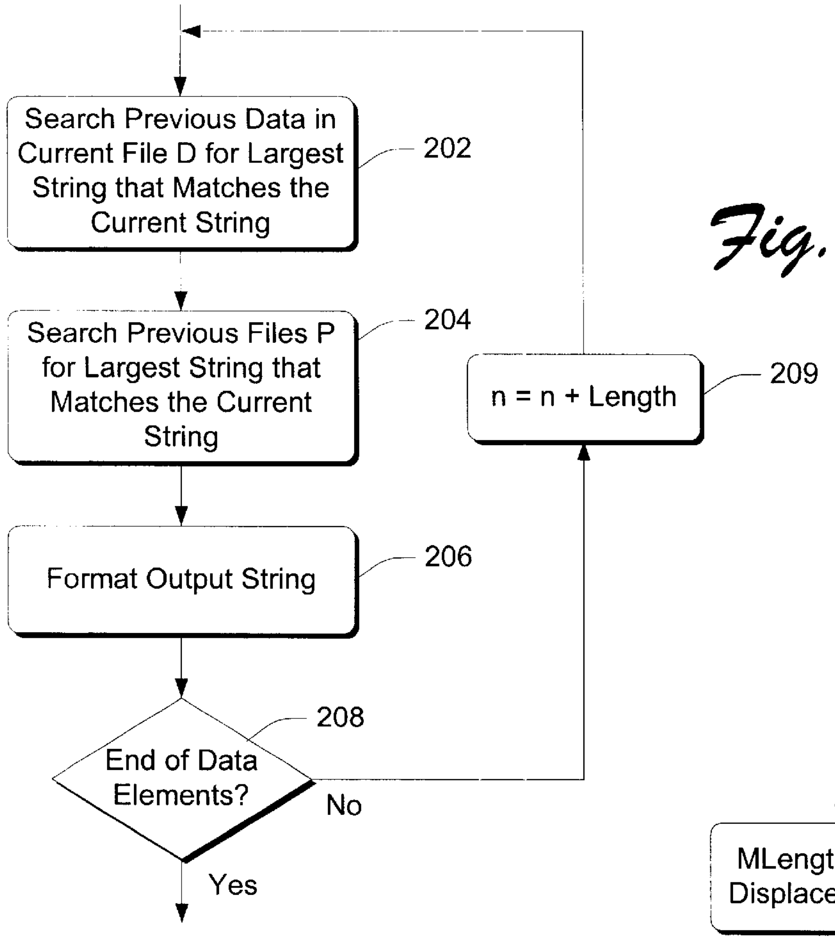
FIG. 7 is a flowchart showing general pattern-matching steps in accordance with the invention.

FIG. 7 shows the general steps involved in finding the largest previous matching string in the combined data of the current file and any previous files. In this discussion, it is assumed that there is a plurality of files that will be compressed as a group. The server progresses through the data elements of the files in order. The current data file (the one containing the data element being examined) is referenced as "file D." A particular data element is referenced as D(n), where n is the absolute position of the data element in file D.

In FIG. 7, a first step 202 comprises searching previous data elements in the current file (file D) for the largest string that matches the current string. The "current string" is a string, having an indefinite length, that starts at or is begun by the current data element. The current data element is the one that is currently being examined. As will be explained in more detail below, this step is performed by referencing the indexes associated with the current file.

After finding the largest matching string in the current data file, the server performs a step 204 of searching data elements in previous files (referred to as files P) for the largest string matching the current string. This step utilizes the lookup tables and indexes associated with the previous files. Again, this step will be described in more detail below.

Step 206 comprises a compressed output string that reflects the results of the searches conducted in steps 202 and 204, including the displacement and length of the largest previous string, if one was found.

As indicated by decision block 208, steps 202, 204, and 206 are repeated until there are no more data elements for processing. After each iteration, a step 209 is performed of incrementing n by the length of the most recently found matching string.

Figure 8:
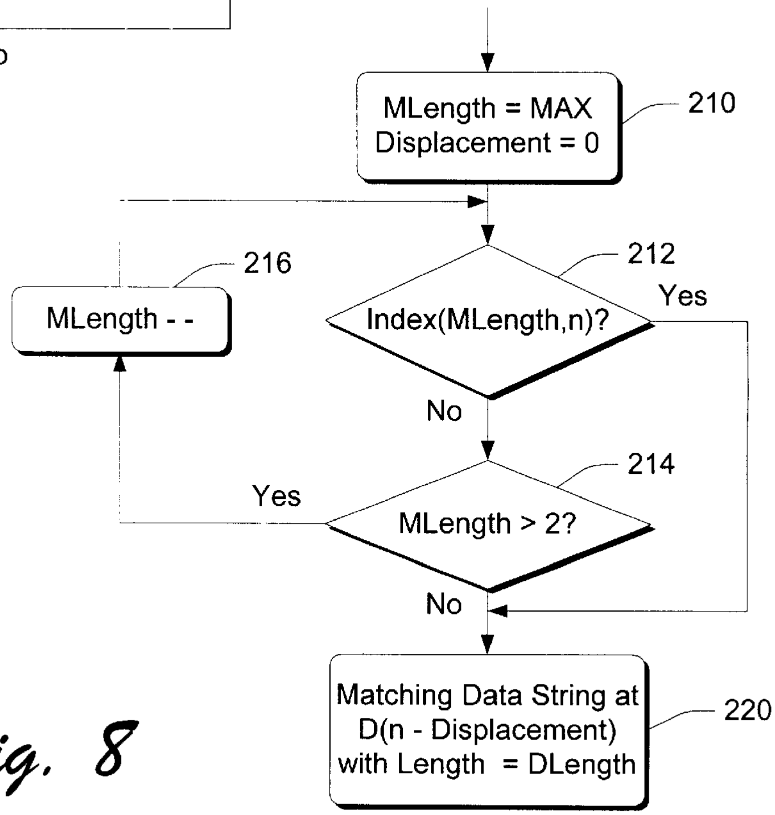
FIGS. 8 and 9 are flowcharts showing more specific pattern-matching steps in accordance with the invention.

FIG. 8 shows step 202 in more detail. The steps of FIG. 8 find the largest previous string in current file D that matches a string begun by the current data element D(n). The nomenclature Index(b,c) is used to indicate the index entry in index b that corresponds to the character at absolute location c.

An initial step 210 comprises initializing variables. A variable MLength is initialized to MAX, where MAX is the highest match length for which an index is provided (six in the example given above). A variable DLength is initialized to 1, and a variable Displacement is initialized to 0. The following step 212 comprises checking whether there is an entry at Index(MLength,n). If there is not, this indicates that there is no matching string of length MLength in the current data file. A step 214 is then performed to determine whether MLength is greater than 2. If the result of this test is true, MLength is decremented by 1 in a step 216 and step 212 is repeated. If at any time the test if step 212 is true, or if the test of step 214 becomes negative, the values of Displacement and DLength are recorded in step 220 as the length and displacement of the largest previous matching string in the current data file. A displacement of 0 indicates that no matches were found.

FIG. 8 does not address the special case where a match is found in the largest available index (index 6 in the example). In this special case, it is desirable to chain back through this index and examine all matches of the corresponding match length, and select the one having the longest match length (there might be a match greater than a match size of MAX).

Figure 9:
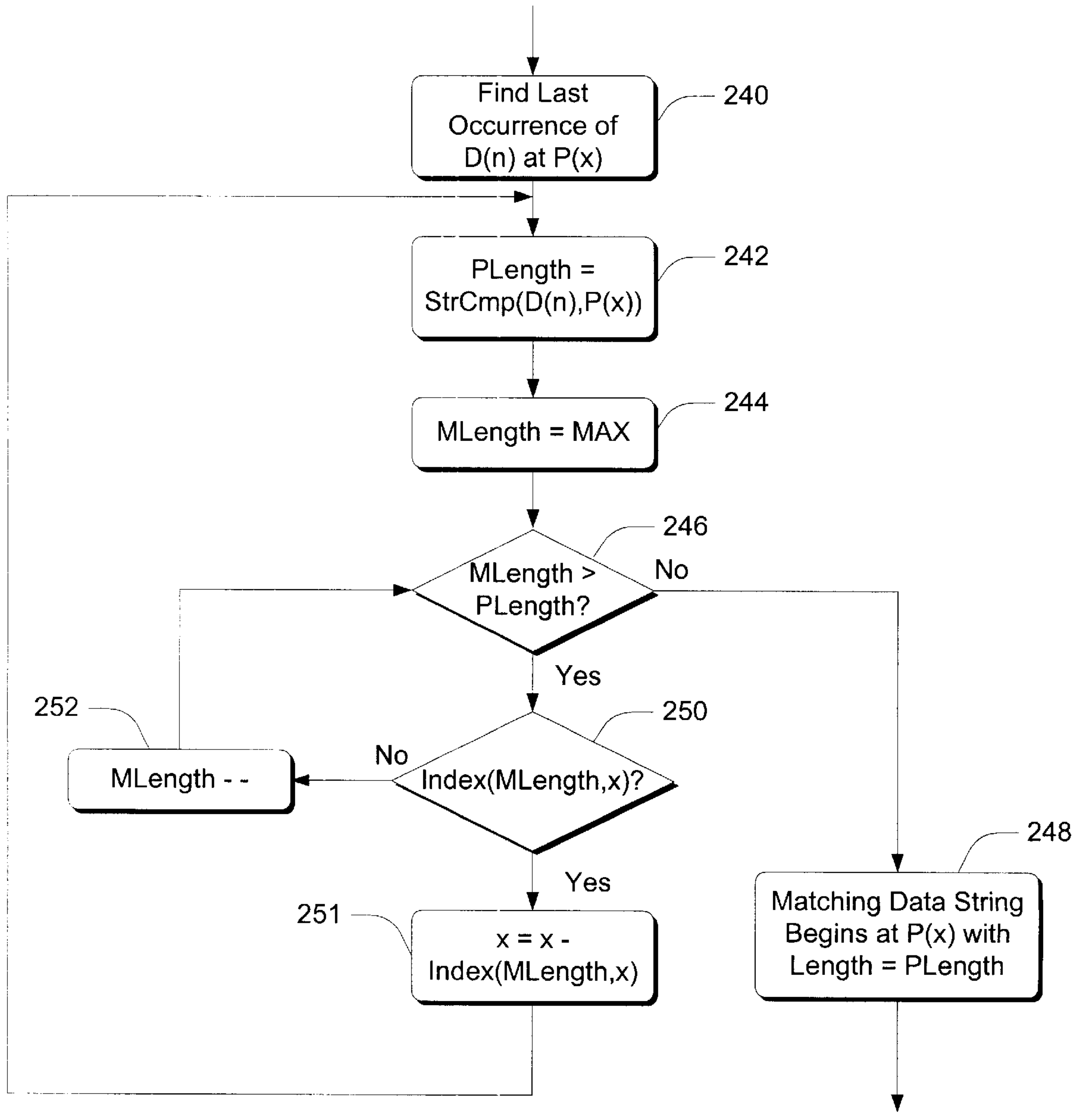

FIG. 9 shows step 204 in more detail. The steps of FIG. 9 find the largest string in a previous data file P that matches the current string, and are repeated for all previous data files. A step 240 comprises finding a matching data element in previous data file P that is the last occurrence of the current data element in data file P. This matching data element is referred to as element P(x), where x indicates the absolute position of the element in data file P. This step is performed by referencing the lookup table associated with data file P.

A step 242 comprises comparing strings begun by the current data element D(n) and the matching data element P(x) to determine a tentative match length PLength. Specifically, this step setting variable PLength to the value returned by StrCmp(D(n),P(x)) where StrCmp(q,r) is a function that returns the matching length of two strings q and r.

Following steps comprise referencing the displacement index entries for the matching data element P(x) to find any prior matching string in file P having a match length greater than the tentative match length, and changing the matching data element to be the beginning data element of any such prior matching string.

More specifically, step 244 comprises setting a variable MLength to MAX, where MAX is the highest match length for which an index is provided. Step 246 is a decision regarding whether the MLength is larger than the tentative match length PLength. A false result indicates that index MLength references previous strings that are no larger than the matching string found at P(x). If this is the case, no further searching is performed; the largest matching data string in file P is at P(x) and has a length PLength. This result is indicated block 248.

If the result of step 246 is true, a step 250 is performed of checking whether there is an index entry in index MLength for data element x of data files P. If there is no such entry, step 252 is performed of decrementing MLength and repeating step 246. If there is an entry at Index(Mlength,x), this indicates that there is a larger matching string at position x-Index(MLength,x). Accordingly, x is set equal to this new position in a step 251, whereupon execution continues with step 242 which computes a new tentative match length based on the new position in file P and which is followed by a further repetition of steps already described.

Again, FIG. 9 ignores the possibility of a match length greater than MAX. To allow for this possibility, it is necessary to take special steps when the steps of FIG. 9 yield a match length of MAX. Specifically, the algorithm should link back through all the previous matching strings having a length of MAX, to determine whether any of them have a match length that is actually greater than MAX.

As a possible enhancement, server 12 can be configured to temporarily update the various displacement indexes as the process proceeds, to reflect displacements back into matching strings from previous files. Such displacements into previous files are referred to as cross-file displacements. Such cross-file displacements are valid only during compression of a particular subset of files.

Conclusion

By pre-processing data files and storing ancillary data along with the data files, the invention allows cross-file compression to be performed more efficiently in situations where clients are able to request different subsets of available files.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A method of pre-processing a data file for later compression, the data file having a plurality of ordered data elements, wherein respective data elements begin strings of different lengths, the method comprising:

creating a plurality of displacement indexes for different match lengths;

wherein a particular displacement index for a particular match length indicates displacements from respective data elements to prior strings of the particular match length that match strings of the particular match length begun by the respective data elements;

storing the displacement indexes in association with the data file.

2. A method as recited in claim 1, further comprising:

creating a lookup table indicating last occurrences of different data element values in the data file;

storing the lookup table in association with the data file.

3. A method as recited in claim 1, further comprising:

creating one or more lookup tables indicating potential last occurrences of different strings of different lengths in the data file;

storing the lookup tables in association with the individual data file.

4. A method as recited in claim 1, wherein the displacement indexes include displacement indexes for match lengths of at least one through four.

5. A method as recited in claim 1, wherein the displacement indexes include no more than ten displacement indexes.

6. A computer-readable storage medium containing instructions that are executable to perform the method recited in claim 1.

7. One or more computer-readable storage media, comprising:

a data file having a plurality of ordered data elements, wherein respective data elements begin strings of different lengths;

a plurality of displacement indexes for different match lengths associated with the data file;

wherein a particular displacement index for a particular match length indicates displacements from respective data elements to prior strings of the particular match length that match strings of the particular match length begun by the respective data elements.

8. One or more computer-readable storage media as recited in claim 7, further comprising a lookup table associated with the data file, the lookup table indicating last occurrences of different data element values in the data file.

9. One or more computer-readable storage media as recited in claim 7, further comprising one or more lookup tables associated with the data file, the lookup tables indicating potential last occurrences of different strings of different lengths in the data file.

10. One or more computer-readable storage media as recited in claim 7, wherein the displacement indexes include displacement indexes for match lengths of at least one through four.

11. One or more computer-readable storage media as recited in claim 7, wherein the displacement indexes include no more than ten displacement indexes associated with an individual data file.

12. One or more computer-readable storage media, comprising:

a plurality of data files each having a plurality of ordered data elements, wherein respective data elements begin strings of different lengths;

one or more indexes stored in association with each data file, the indexes for a particular data file indicating prior strings in the same data file that match strings begun by the respective data elements.

13. One or more computer-readable storage media as recited in claim 12, wherein the indexes comprise displacement indexes, wherein a particular displacement index indicates displacements from respective data elements to prior strings of a particular length that match strings begun by the respective data elements.

14. One or more computer-readable storage media having a program that compresses a concatenation of data files each having a plurality of ordered data elements, wherein respective data elements begin strings, wherein each of the data files is stored with a plurality of displacement indexes for different match lengths, and wherein a particular displacement index for a particular match length indicates displacements from respective data elements to prior strings of the particular match length that match strings of the particular match length begun by the respective data elements, the program being configured to perform instructions comprising:

compressing the concatenation of data files using a pattern-matching compression scheme that attempts to represent given strings by referencing previous matching strings across file boundaries;

for a string begun by a current data element in a current data file:

finding a previous matching string in the current data file by referencing the displacement indexes associated with the current data file;

searching for a larger matching string in previous data files by referencing the displacement indexes associated with the previous data files.

15. One or more computer-readable storage media as recited in claim 14, further comprising temporarily updating the one or more displacement indexes with cross-file displacements while compressing a particular subset of data files.

16. One or more computer-readable storage media as recited in claim 14, wherein the displacement indexes have entries for individual data elements of the associated data files, and wherein the searching comprises:

finding a matching data element which is the last occurrence of the current data element in a previous data file;

comparing strings begun by the current data element and the matching data element to determine a tentative match length;

referencing the displacement index entries for the matching data element to find any prior matching string in the previous data file having a match length greater than the tentative match length and changing the matching data element to be the beginning data element of any such prior matching string;

repeating the comparing and referencing.

17. One or more computer-readable storage media as recited in claim 14, wherein the displacement indexes have entries for individual data elements of the associated data files, and wherein the searching comprises:

referencing a lookup table to find a matching data string in the previous data file that matches a string begun by the current data element, wherein the matching data string begins with a matching data element;

comparing the strings begun by the current data element and the matching data element to determine a tentative match length;

referencing the displacement index entries for the matching data element to find any prior matching data string in the previous data file having a match length greater than the tentative match length and changing the matching data element to be the beginning data element of any such prior matching data string;

repeating the comparing and referencing.

18. One or more computer-readable storage media as recited in claim 14, further comprising temporarily updating the one or more displacement indexes with cross-file displacements while compressing a particular subset of data files.

19. A method of compressing a concatenation of data files each having a plurality of ordered data elements, wherein respective data elements begin strings, the method comprising:

for each data file, creating a plurality of displacement indexes for different match lengths, wherein a particular displacement index for a particular match length indicates displacements from respective data elements to prior strings of the particular match length that match strings of the particular match length begun by the respective data elements;

storing the displacement indexes in association with the individual data files;

compressing the concatenation of data files using a pattern-matching compression scheme that attempts to represent given strings by referencing previous matching strings across file boundaries;

for a string begun by a current data element in a current data file:

finding a previous matching string in the current data file by referencing the displacement indexes associated with the current data file;

searching for a larger matching string in previous data files by referencing the displacement indexes associated with the previous data files.

20. A method as recited in claim 19, wherein the displacement indexes have entries for individual data elements of the associated data files, and wherein the searching comprises:

finding a matching data element which is the last occurrence of the current data element in a previous data file;

comparing strings begun by the current data element and the matching data element to determine a tentative match length;

referencing the displacement index entries for the matching data element to find any prior matching string in the previous data file having a match length greater than the tentative match length and changing the matching data element to be the beginning data element of any such prior matching string;

repeating the comparing and referencing.

21. A method as recited in claim 19, wherein the displacement indexes have entries for individual data elements of the associated data files, and wherein the searching comprises:

referencing a lookup table to find a matching data string in a previous data file that matches a string begun by the current data element, wherein the matching data string begins with a matching data element;

comparing the strings begun by the current data element and the matching data element to determine a tentative match length;

referencing the displacement index entries for the matching data element to find any prior matching data string in the previous data file having a match length greater than the tentative match length and changing the matching data element to be the beginning data element of any such prior matching data string;

repeating the comparing and referencing.

22. A method as recited in claim 19, further comprising temporarily updating the one or more displacement indexes with cross-file displacements while compressing a particular subset of data files.

23. A method of providing data files to clients in response to requests from such clients, comprising:

storing a plurality of available data files on one or more data storage media, each data file having a plurality of ordered data elements, wherein respective data elements begin strings of different lengths;

storing one or more indexes on said one or more data storage media, wherein there are indexes corresponding to each data file indicating prior matching strings in that data file for respective data elements;

providing different subsets of the available data files to clients in response to requests from such clients for such subsets;

referencing the one or more indexes associated with the data files of the requested subsets to compress the requested subsets across file boundaries before providing the subsets to the requesting clients.

24. A method as recited in claim 23, wherein the indexes comprise displacement indexes, and wherein a particular displacement index indicates displacements from respective data elements to prior strings of a particular length that match strings begun by the respective data elements.

25. A computer-readable storage medium containing instructions that are executable to perform the method recited in claim 23.

26. A computer server that provides data files to clients in response to requests from such clients, the computer server comprising:

one or more data storage media;

the data storage media containing a plurality of available data files each having a plurality of ordered data elements, wherein respective data elements begin strings of different lengths;

the data storage media further containing one or more indexes associated with each data file, the indexes for a particular data file indicating prior matching strings in that data file for respective data elements;

the computer server being programmed to provide different subsets of the available data files to clients in response to requests from such clients for such subsets;

wherein the computer server references the one or more indexes associated with the data files of the requested subsets to compress the requested subsets across file boundaries before providing the subsets to the requesting clients.

27. A computer server as recited in claim 26, wherein the indexes comprise displacement indexes, and wherein a particular displacement index indicates displacements from respective data elements to prior strings of a particular length that match strings begun by the respective data elements.

28. A computer server that provides data files to clients in response to requests from such clients, the computer server comprising:

one or more data storage media;

the data storage media containing a plurality of available data files each having a plurality of ordered data elements, wherein respective data elements begin strings of different lengths;

the data storage media further containing one or more displacement indexes associated with each data file for different match lengths, wherein a particular displacement index for a particular match length indicates displacements from respective data elements to prior strings of the particular match length that match strings of the particular match length begun by the respective data elements;

the computer server being programmed to provide different subsets of the available data files to clients in response to requests from such clients for such subsets, wherein the computer server sequentially examines data elements of each subset of data files using a pattern-matching compression scheme that attempts to represent given strings by referencing prior matching strings across file boundaries;

wherein the computer server finds a prior matching string for a string begun by a current data element in a current data file by performing the following:

finding a previous matching string in the current data file by referencing the displacement indexes associated with the current data file;

searching for a larger matching string in previous data files by referencing the displacement indexes associated with the previous data files.

29. A computer server as recited in claim 28, wherein the displacement indexes have entries for individual data elements of the associated data files, and wherein the searching comprises:

finding a matching data element which is the last occurrence of the current data element in a previous data file;

comparing strings begun by the current data element and the matching data element to determine a tentative match length;

referencing the displacement index entries for the matching data element to find any prior matching string in the previous data file having a match length greater than the tentative match length and changing the matching data element to be the beginning data element of any such prior matching string;

repeating the comparing and referencing.

30. A computer server as recited in claim 28, wherein the displacement indexes have entries for individual data elements of the associated data files, and wherein the searching comprises:

referencing a lookup table to find a matching data string in a previous data file that matches a string begun by the current data element, wherein the matching data string begins with a matching data element;

comparing strings begun by the current data element and the matching data element to determine a tentative match length;

referencing the displacement index entries for the matching data element to find any prior matching data string in the previous data file having a match length greater than the tentative match length and changing the matching data element to be the beginning data element of any such prior matching data string;

repeating the comparing and referencing.

31. A method of providing data files to clients in response to requests from such clients, comprising:

storing a plurality of available data files on one or more data storage media, each data file having a plurality of ordered data elements, wherein respective data elements begin strings of different lengths;

storing one or more indexes on said one or more data storage media for each of the available data files, wherein a particular displacement index for a particular match length indicates displacements from respective data elements to prior strings of the particular match length that match strings of the particular match length begun by the respective data elements;

in response to client requests for subsets of the available data files, compressing each subset of data files using a pattern-matching compression scheme that attempts to represent given strings by referencing prior matching strings across file boundaries;

performing the following to find a prior matching string for a string begun by a current data element in a current data file:

finding a previous matching string in the current data file by referencing the displacement indexes associated with the current data file;

searching for a larger matching string in previous data files by referencing the displacement indexes associated with the previous data files.

32. A method as recited in claim 31, further comprising temporarily updating the one or more indexes with cross-file displacements while compressing a particular subset of data files.

33. A method as recited in claim 31, wherein the displacement indexes have entries for individual data elements of the associated data files, and wherein the searching comprises:

finding a matching data element which is the last occurrence of the current data element in a previous data file;

comparing strings begun by the current data element and the matching data element to determine a tentative match length;

referencing the displacement index entries for the matching data element to find any prior matching string in the previous data file having a match length greater than the tentative match length and changing the matching data element to be the beginning data element of any such prior matching string;

repeating the comparing and referencing.

34. A method as recited in claim 31, wherein the displacement indexes have entries for individual data elements of the associated data files, and wherein the searching comprises:

referencing a lookup table to find a matching data string in a previous data file that matches a string begun by the current data element, wherein the matching data string begins with a matching data element;

comparing strings begun by the current data element and the matching data element to determine a tentative match length;

referencing the displacement index entries for the matching data element to find any prior matching data string in the previous data file having a match length greater than the tentative match length and changing the matching data element to be the beginning data element of any such prior matching data string;

repeating the comparing and referencing.

35. A computer-readable storage medium containing instructions that are executable to perform the method recited in claim 31.

* * * * *

UNITED STATES PATENT AND TRADEMARK OFFICE
CERTIFICATE OF CORRECTION

PATENT NO. : 6,226,628 B1
DATED : May 1, 2001
INVENTOR(S) : Jonathan Forbes et al.

It is certified that error appears in the above-identified patent and that said Letters Patent is hereby corrected as shown below:

<u>Column 5,</u>
Line 14, delete "to" before "single".

Signed and Sealed this

Thirteenth Day of November, 2001

Attest:

Nicholas P. Godici

NICHOLAS P. GODICI

*Attesting Officer* *Acting Director of the United States Patent and Trademark Office*